United States Patent
Chung-Long-Shan et al.

(10) Patent No.: US 7,988,033 B2
(45) Date of Patent: *Aug. 2, 2011

(54) METHOD OF REDUCING WIRE BOND PROFILE HEIGHT IN INTEGRATED CIRCUITS MOUNTED TO CIRCUIT BOARDS

(75) Inventors: Laval Chung-Long-Shan, Balmain (AU); Kiangkai Tankongchumruskul, Balmain (AU); Kia Silverbrook, Balmain (AU)

(73) Assignee: Silverbrook Research Pty Ltd, Balmain, New South Wales (AU)

( * ) Notice: Subject to any disclaimer, the term of this patent is extended or adjusted under 35 U.S.C. 154(b) by 60 days.

This patent is subject to a terminal disclaimer.

(21) Appl. No.: 11/860,539

(22) Filed: Sep. 25, 2007

(65) Prior Publication Data
US 2009/0081832 A1    Mar. 26, 2009

(51) Int. Cl.
*B21D 39/00*    (2006.01)

(52) U.S. Cl. ........................................................ 228/155

(58) Field of Classification Search .................. 228/155, 228/4.5, 180.5, 180.1, 180.22
See application file for complete search history.

(56) References Cited

U.S. PATENT DOCUMENTS

| | | | |
|---|---|---|---|
| 4,595,938 A * | 6/1986 | Conta et al. | 347/55 |
| 5,468,999 A | 11/1995 | Lin et al. | |
| 5,577,319 A | 11/1996 | Knecht | |
| 5,863,488 A * | 1/1999 | Moriya | 264/512 |
| 6,022,583 A | 2/2000 | Falcone et al. | |
| 6,143,588 A | 11/2000 | Glenn | |
| 6,291,884 B1 * | 9/2001 | Glenn et al. | 257/747 |
| 6,326,240 B1 * | 12/2001 | Liaw | 438/113 |
| 6,709,893 B2 * | 3/2004 | Moden et al. | 438/113 |
| 6,885,093 B2 | 4/2005 | Lo et al. | |
| 2001/0014486 A1 | 8/2001 | Glenn | |
| 2003/0160311 A1 | 8/2003 | Ismail et al. | |
| 2004/0241906 A1 * | 12/2004 | Chan | 438/107 |
| 2005/0242159 A1 * | 11/2005 | Yajima | 228/180.5 |
| 2007/0045872 A1 | 3/2007 | Fee | |
| 2008/0237887 A1 * | 10/2008 | Takiar et al. | 257/777 |
| 2009/0032926 A1 * | 2/2009 | Sharifi | 257/686 |

FOREIGN PATENT DOCUMENTS

WO    WO 03/006230 A1    1/2003

* cited by examiner

*Primary Examiner* — Jessica L Ward
*Assistant Examiner* — Steven Ha

(57) ABSTRACT

A method of profiling a wire bond between a contact pad on a die, and a conductor on a supporting structure, by electrically connecting the contact pad on the die to the conductor on the supporting structure with a wire bond, the wire bond extending in an arc from the contact pad to the conductor, pushing on the wire bond to collapse the arc and plastically deform the wire bond, and then releasing the wire bonds such that the plastic deformation maintains the wire bond in a flatter profile shape. The strength of the wire bond is known to be relatively small; of the order of 3 to 5 grams force. However, the Applicant's work has found that the wire bond structure is robust enough to withstand a certain degree of work hardening from plastic deformation. The arc of the wire bond can be deformed into a flatter profile without compromising the electrical connection with the PCB.

16 Claims, 9 Drawing Sheets

METHOD OF REDUCING WIRE BOND PROFILE HEIGHT IN INTEGRATED CIRCUITS MOUNTED TO CIRCUIT BOARDS

FIELD OF THE INVENTION

The invention relates to the field of integrated circuit packaging. In particular, the encapsulation of the wire bonds between a circuit board and the contact pads on the integrated circuit die.

CO-PENDING APPLICATIONS

The following applications have been filed by the Applicant simultaneously with the present application:

| | | | |
|---|---|---|---|
| 11860538 | 11860540 | 11860541 | 11860542 |

The disclosures of these co-pending applications are incorporated herein by reference.

CROSS REFERENCES TO RELATED APPLICATIONS

Various methods, systems and apparatus relating to the present invention are disclosed in the following U.S. Patents/Patent Applications filed by the applicant or assignee of the present invention:

| | | | | | | |
|---|---|---|---|---|---|---|
| 6,405,055 | 6,628,430 | 7,136,186 | 10/920,372 | 7,145,689 | 7,130,075 | 7,081,974 |
| 7,177,055 | 7,209,257 | 7,161,715 | 7,154,632 | 7,158,258 | 7,148,993 | 7,075,684 |
| 7,158,809 | 11/225,172 | 11/474,280 | 11/635,482 | 11/635,526 | 11/650,545 | 11/653,241 |
| 11/653,240 | 11/758,648 | 7,241,005 | 7,108,437 | 6,915,140 | 6,999,206 | 7,136,198 |
| 7,092,130 | 7,249,108 | 6,566,858 | 6,331,946 | 6,246,970 | 6,442,525 | 09/517,384 |
| 09/505,951 | 6,374,354 | 7,246,098 | 6,816,968 | 6,757,832 | 6,334,190 | 6,745,331 |
| 7,249,109 | 10/203,559 | 7,197,642 | 7,093,139 | 10/636,263 | 10/636,283 | 10/866,608 |
| 7,210,038 | 10/902,833 | 10/940,653 | 10/942,858 | 11/706,329 | 11/757,385 | 11/758,642 |
| 7,170,652 | 6,967,750 | 6,995,876 | 7,099,051 | 11/107,942 | 7,193,734 | 11/209,711 |
| 11/599,336 | 7,095,533 | 6,914,686 | 7,161,709 | 7,099,033 | 11/003,786 | 7,258,417 |
| 11/003,418 | 11/003,334 | 11/003,600 | 11/003,404 | 11/003,419 | 11/003,700 | 7,255,419 |
| 11/003,618 | 7,229,148 | 7,258,416 | 11/003,698 | 11/003,420 | 6,984,017 | 11/003,699 |
| 11/071,473 | 11/748,482 | 11/778,563 | 11/779,851 | 11/778,574 | 11/853,816 | 11/853,814 |
| 11/853,786 | 11/856,694 | 11/003,463 | 11/003,701 | 11/003,683 | 11/003,614 | 11/003,702 |
| 11/003,684 | 7,246,875 | 11/003,617 | 11/764,760 | 11,853,777 | 11/293,800 | 11/293,802 |
| 11/293,801 | 11/293,808 | 11/293,809 | 11/482,975 | 11/482,970 | 11/482,968 | 11/482,972 |
| 11/482,971 | 11/482,969 | 11/097,266 | 11/097,267 | 11/685,084 | 11/685,086 | 11/685,090 |
| 11/740,925 | 11/763,444 | 11/763,443 | 11/518,238 | 11/518,280 | 11/518,244 | 11/518,243 |
| 11/518,242 | 11/084,237 | 11/084,240 | 11/084,238 | 11/357,296 | 11/357,298 | 11/357,297 |
| 11/246,676 | 11/246,677 | 11/246,678 | 11/246,679 | 11/246,680 | 11/246,681 | 11/246,714 |
| 11/246,713 | 11/246,689 | 11/246,671 | 11/246,670 | 11/246,669 | 11/246,704 | 11/246,710 |
| 11/246,688 | 11/246,716 | 11/246,715 | 11/246,707 | 11/246,706 | 11/246,705 | 11/246,708 |
| 11/246,693 | 11/246,692 | 11/246,696 | 11/246,695 | 11/246,694 | 11/482,958 | 11/482,955 |
| 11/482,962 | 11/482,963 | 11/482,956 | 11/482,954 | 11/482,974 | 11/482,957 | 11/482,987 |
| 11/482,959 | 11/482,960 | 11/482,961 | 11/482,964 | 11/482,965 | 11/482,976 | 11/482,973 |
| 11/495,815 | 11/495,816 | 11/495,817 | 6,227,652 | 6,213,588 | 6,213,589 | 6,231,163 |
| 6,247,795 | 6,394,581 | 6,244,691 | 6,257,704 | 6,416,168 | 6,220,694 | 6,257,705 |
| 6,247,794 | 6,234,610 | 6,247,793 | 6,264,306 | 6,241,342 | 6,247,792 | 6,264,307 |
| 6,254,220 | 6,234,611 | 6,302,528 | 6,283,582 | 6,239,821 | 6,338,547 | 6,247,796 |
| 6,557,977 | 6,390,603 | 6,362,843 | 6,293,653 | 6,312,107 | 6,227,653 | 6,234,609 |
| 6,238,040 | 6,188,415 | 6,227,654 | 6,209,989 | 6,247,791 | 6,336,710 | 6,217,153 |
| 6,416,167 | 6,243,113 | 6,283,581 | 6,247,790 | 6,260,953 | 6,267,469 | 6,588,882 |
| 6,742,873 | 6,918,655 | 6,547,371 | 6,938,989 | 6,598,964 | 6,923,526 | 6,273,544 |
| 6,309,048 | 6,420,196 | 6,443,558 | 6,439,689 | 6,378,989 | 6,848,181 | 6,634,735 |
| 6,299,289 | 6,299,290 | 6,425,654 | 6,902,255 | 6,623,101 | 6,406,129 | 6,505,916 |
| 6,457,809 | 6,550,895 | 6,457,812 | 7,152,962 | 6,428,133 | 7,216,956 | 7,080,895 |
| 11/144,844 | 7,182,437 | 11/599,341 | 11/635,533 | 11/607,976 | 11/607,975 | 11/607,999 |
| 11/607,980 | 11/607,979 | 11/607,978 | 11/735,961 | 11/685,074 | 11/696,126 | 11/696,144 |
| 11/696,650 | 11/763,446 | 10/407,212 | 7,252,366 | 10/683,064 | 10/683,041 | 11,766,713 |
| 11/841,647 | 11/482,980 | 11/563,684 | 11/482,967 | 11/482,966 | 11/482,988 | 11/482,989 |
| 11/293,832 | 11/293,838 | 11/293,825 | 11/293,841 | 11/293,799 | 11/293,796 | 11/293,797 |
| 11/293,798 | 11/124,158 | 11/124,196 | 11/124,199 | 11/124,162 | 11/124,202 | 11/124,197 |
| 11/124,154 | 11/124,198 | 11/124,153 | 11/124,151 | 11/124,160 | 11/124,192 | 11/124,175 |
| 11/124,163 | 11/124,149 | 11/124,152 | 11/124,173 | 11/124,155 | 7,236,271 | 11/124,174 |
| 11/124,194 | 11/124,164 | 11/124,200 | 11/124,195 | 11/124,166 | 11/124,150 | 11/124,172 |
| 11/124,165 | 11/124,186 | 11/124,185 | 11/124,184 | 11/124,182 | 11/124,201 | 11/124,171 |
| 11/124,181 | 11/124,161 | 11/124,156 | 11/124,191 | 11/124,159 | 11/124,176 | 11/124,188 |
| 11/124,170 | 11/124,187 | 11/124,189 | 11/124,190 | 11/124,180 | 11/124,193 | 11/124,183 |
| 11/124,178 | 11/124,177 | 11/124,148 | 11/124,168 | 11/124,167 | 11/124,179 | 11/124,169 |
| 11/187,976 | 11/188,011 | 11/188,014 | 11/482,979 | 11/735,490 | 11/853,018 | 11/228,540 |
| 11/228,500 | 11/228,501 | 11/228,530 | 11/228,490 | 11/228,531 | 11/228,504 | 11/228,533 |
| 11/228,502 | 11/228,507 | 11/228,482 | 11/228,505 | 11/228,497 | 11/228,487 | 11/228,529 |
| 11/228,484 | 11/228,489 | 11/228,518 | 11/228,536 | 11/228,496 | 11/228,488 | 11/228,506 |
| 11/228,516 | 11/228,526 | 11/228,539 | 11/228,538 | 11/228,524 | 11/228,523 | 11/228,519 |
| 11/228,528 | 11/228,527 | 11/228,525 | 11/228,520 | 11/228,498 | 11/228,511 | 11/228,522 |
| 111/228,515 | 11/228,537 | 11/228,534 | 11/228,491 | 11/228,499 | 11/228,509 | 11/228,492 |
| 11/228,493 | 11/228,510 | 11/228,508 | 11/228,512 | 11/228,514 | 11/228,494 | 11/228,495 |
| 11/228,486 | 11/228,481 | 11/228,477 | 11/228,485 | 11/228,483 | 11/228,521 | 11/228,517 |
| 11/228,532 | 11/228,513 | 11/228,503 | 11/228,480 | 11/228,535 | 11/228,478 | 11/228,479 |
| 6,087,638 | 6,340,222 | 6,041,600 | 6,299,300 | 6,067,797 | 6,286,935 | 6,044,646 |

-continued

| | | | | | | |
|---|---|---|---|---|---|---|
| 6,382,769 | 10/868,866 | 6,787,051 | 6,938,990 | 11/242,916 | 11/242,917 | 11/144,799 |
| 11/198,235 | 11/766,052 | 7,152,972 | 11/592,996 | 6,746,105 | 11/763,440 | 11/763,442 |
| 11/246,687 | 11/246,718 | 11/246,685 | 11/246,686 | 11/246,703 | 11/246,691 | 11/246,711 |
| 11/246,690 | 11/246,712 | 11/246,717 | 11/246,709 | 11/246,700 | 11/246,701 | 11/246,702 |
| 11/246,668 | 11/246,697 | 11/246,698 | 11/246,699 | 11/246,675 | 11/246,674 | 11/246,667 |
| 11/829,957 | 11/829,960 | 11/829,961 | 11/829,962 | 11/829,963 | 11/829,966 | 11/829,967 |
| 11/829,968 | 11/829,969 | 7,156,508 | 7,159,972 | 7,083,271 | 7,165,834 | 7,080,894 |
| 7,201,469 | 7,090,336 | 7,156,489 | 10/760,233 | 10/760,246 | 7,083,257 | 7,258,422 |
| 7,255,423 | 7,219,980 | 10/760,253 | 10/760,255 | 10/760,209 | 7,118,192 | 10/760,194 |
| 10/760,238 | 7,077,505 | 7,198,354 | 7,077,504 | 10/760,189 | 7,198,355 | 10/760,232 |
| 10/760,231 | 7,152,959 | 7,213,906 | 7,178,901 | 7,222,938 | 7,108,353 | 7,104,629 |
| 11/446,227 | 11/454,904 | 11/472,345 | 11/474,273 | 7,261,401 | 11/474,279 | 11/482,939 |
| 11/482,950 | 11/499,709 | 11/592,984 | 11/601,668 | 11/603,824 | 11/601,756 | 11/601,672 |
| 11/650,546 | 11/653,253 | 11/706,328 | 11/706,299 | 11/706,965 | 11/737,080 | 11/737,041 |
| 11/778,062 | 11/778,566 | 11/782,593 | 11/246,684 | 11/246,672 | 11/246,673 | 11/246,683 |
| 11/246,682 | 60/939,086 | 7,246,886 | 7,128,400 | 7,108,355 | 6,991,322 | 10/728,790 |
| 7,118,197 | 10/728,784 | 10/728,783 | 7,077,493 | 6,962,402 | 10/728,803 | 7,147,308 |
| 10/728,779 | 7,118,198 | 7,168,790 | 7,172,270 | 7,229,155 | 6,830,318 | 7,195,342 |
| 7,175,261 | 10/773,183 | 7,108,356 | 7,118,202 | 10/773,186 | 7,134,744 | 10/773,185 |
| 7,134,743 | 7,182,439 | 7,210,768 | 10/773,187 | 7,134,745 | 7,156,484 | 7,118,201 |
| 7,111,926 | 10/773,184 | 7,018,021 | 11/060,751 | 11/060,805 | 11/188,017 | 7,128,402 |
| 11/298,774 | 11/329,157 | 11/490,041 | 11/501,767 | 11/499,736 | 7,246,885 | 7,229,156 |
| 11/505,846 | 11/505,857 | 11/505,856 | 11/524,908 | 11/524,938 | 7,258,427 | 11/524,912 |
| 11/592,999 | 11/592,995 | 11/603,825 | 11/649,773 | 11/650,549 | 11/653,237 | 11/706,378 |
| 11/706,962 | 11/749,118 | 11/754,937 | 11/749,120 | 11/744,885 | 11/779,850 | 11/765,439 |
| 11/842,950 | 11/839,539 | 11/097,308 | 11/097,309 | 7,246,876 | 11/097,299 | 11/097,310 |
| 11/097,213 | 11/210,687 | 11/097,212 | 7,147,306 | 7,261,394 | 11/764,806 | 11/782,595 |
| 11/482,953 | 11/482,977 | 11/544,778 | 11/544,779 | 11/764,808 | 09/575,197 | 7,079,712 |
| 6,825,945 | 09/575,165 | 6,813,039 | 6,987,506 | 7,038,797 | 6,980,318 | 6,816,274 |
| 7,102,772 | 09/575,186 | 6,681,045 | 6,728,000 | 7,173,722 | 7,088,459 | 09/575,181 |
| 7,068,382 | 7,062,651 | 6,789,194 | 6,789,191 | 6,644,642 | 6,502,614 | 6,622,999 |
| 6,669,385 | 6,549,935 | 6,987,573 | 6,727,996 | 6,591,884 | 6,439,706 | 6,760,119 |
| 09/575,198 | 6,290,349 | 6,428,155 | 6,785,016 | 6,870,966 | 6,822,639 | 6,737,591 |
| 7,055,739 | 7,233,320 | 6,830,196 | 6,832,717 | 6,957,768 | 09/575,172 | 7,170,499 |
| 7,106,888 | 7,123,239 | 11/066,161 | 11/066,160 | 11/066,159 | 11/066,158 | 11/066,165 |
| 10/727,181 | 10/727,162 | 10/727,163 | 10/727,245 | 7,121,639 | 7,165,824 | 7,152,942 |
| 10/727,157 | 7,181,572 | 7,096,137 | 10/727,257 | 10/727,238 | 7,188,282 | 10/727,159 |
| 10/727,180 | 10/727,179 | 10/727,192 | 10/727,274 | 10/727,164 | 10/727,161 | 10/727,198 |
| 10/727,158 | 10/754,536 | 10/754,938 | 10/727,227 | 10/727,160 | 10/934,720 | 7,171,323 |
| 11/272,491 | 11/474,278 | 11/488,853 | 11/488,841 | 11/749,750 | 11/749,749 | 10/296,522 |
| 6,795,215 | 7,070,098 | 7,154,638 | 6,805,419 | 6,859,289 | 6,977,751 | 6,398,332 |
| 6,394,573 | 6,622,923 | 6,747,760 | 6,921,144 | 10/884,881 | 7,092,112 | 7,192,106 |
| 11/039,866 | 7,173,739 | 6,986,560 | 7,008,033 | 11/148,237 | 7,222,780 | 11/248,426 |
| 11/478,599 | 11/499,749 | 11/738,518 | 11/482,981 | 11/743,661 | 11/743,659 | 11/752,900 |
| 7,195,328 | 7,182,422 | 11/650,537 | 11/712,540 | 10/854,521 | 10/854,522 | 10/854,488 |
| 10/854,487 | 10/854,503 | 10/854,504 | 10/854,509 | 7,188,928 | 7,093,989 | 10/854,497 |
| 10/854,495 | 10/854,498 | 10/854,511 | 10/854,512 | 10/854,525 | 10/854,526 | 10/854,516 |
| 10/854,508 | 7,252,353 | 10/854,515 | 10/854,506 | 10/854,505 | 10/854,493 | 10/854,494 |
| 10/854,489 | 10/854,490 | 10/854,492 | 10/854,491 | 10/854,528 | 10/854,523 | 10/854,527 |
| 10/854,524 | 10/854,520 | 10/854,514 | 10/854,519 | 10/854,513 | 10/854,499 | 10/854,501 |
| 7,266,661 | 7,243,193 | 10/854,518 | 10/854,517 | 10/934,628 | 7,163,345 | 11/499,803 |
| 11/601,757 | 11/706,295 | 11/735,881 | 11/748,483 | 11/749,123 | 11/766,061 | 11/775,135 |
| 11,772,235 | 11/778,569 | 11/829,942 | 11/014,731 | 11/544,764 | 11/544,765 | 11/544,772 |
| 11/544,773 | 11/544,774 | 11/544,775 | 11/544,776 | 11/544,766 | 11/544,767 | 11/544,771 |
| 11/544,770 | 11/544,769 | 11/544,777 | 11/544,768 | 11/544,763 | 11/293,804 | 11/293,840 |
| 11/293,803 | 11/293,833 | 11/293,834 | 11/293,835 | 11/293,836 | 11/293,837 | 11/293,792 |
| 11/293,794 | 11/293,839 | 11/293,826 | 11/293,829 | 11/293,830 | 11/293,827 | 11/293,828 |
| 11/293,795 | 11/293,823 | 11/293,824 | 11/293,831 | 11/293,815 | 11/293,819 | 11/293,818 |
| 11/293,817 | 11/293,816 | 11/838,875 | 11/482,978 | 11/640,356 | 11/640,357 | 11/640,358 |
| 11/640,359 | 11/640,360 | 11/640,355 | 11/679,786 | 10/760,254 | 10/760,210 | 10/760,202 |
| 7,201,468 | 10/760,198 | 10/760,249 | 7,234,802 | 10/760,196 | 10/760,247 | 7,156,511 |
| 10/760,264 | 7,258,432 | 7,097,291 | 10/760,222 | 10/760,248 | 7,083,273 | 10/760,192 |
| 10/760,203 | 10/760,204 | 10/760,205 | 10/760,206 | 10/760,267 | 10/760,270 | 7,198,352 |
| 10/760,271 | 10/760,275 | 7,201,470 | 7,121,655 | 10/760,184 | 7,232,208 | 10/760,186 |
| 10/760,261 | 7,083,272 | 11/501,771 | 11/583,874 | 11/650,554 | 11/706,322 | 11/706,968 |
| 11/749,119 | 11/779,848 | 11/855,152 | 11/855,151 | 11/014,764 | 11/014,763 | 11/014,748 |
| 11/014,747 | 11/014,761 | 11/014,760 | 11/014,757 | 11/014,714 | 7,249,822 | 11/014,762 |
| 11/014,724 | 11/014,723 | 11/014,756 | 11/014,736 | 11/014,759 | 11/014,758 | 11/014,725 |
| 11/014,739 | 11/014,738 | 11/014,737 | 11/014,726 | 11/014,745 | 11/014,712 | 11/014,715 |
| 11/014,751 | 11/014,735 | 11/014,734 | 11/014,719 | 11/014,750 | 11/014,749 | 7,249,833 |
| 11/758,640 | 11/775,143 | 11/838,877 | 11/014,769 | 11/014,729 | 11/014,743 | 11/014,733 |
| 11/014,754 | 11/014,755 | 11/014,765 | 11/014,766 | 11/014,740 | 11/014,720 | 11/014,753 |
| 7,255,430 | 11/014,744 | 11/014,741 | 11/014,768 | 11/014,767 | 11/014,718 | 11/014,717 |
| 11/014,716 | 11/014,732 | 11/014,742 | 11/097,268 | 11/097,185 | 11/097,184 | 11/778,567 |
| 11,852,958 | 11,852,907 | 11/293,820 | 11/293,813 | 11/293,822 | 11/293,812 | 11/293,821 |
| 11/293,814 | 11/293,793 | 11/293,842 | 11/293,811 | 11/293,807 | 11/293,806 | 11/293,805 |
| 11/293,810 | 11/688,863 | 11/688,864 | 11/688,865 | 11/688,866 | 11/688,867 | 11/688,868 |
| 11/688,869 | 11/688,871 | 11/688,872 | 11/688,873 | 11/741,766 | 11/482,982 | 11/482,983 |
| 11/482,984 | 11/495,818 | 11/495,819 | 11/677,049 | 11/677,050 | 11/677,051 | 11/014,722 |
| 10/760,180 | 7,111,935 | 10/760,213 | 10/760,219 | 10/760,237 | 7,261,482 | 10/760,220 |

-continued

| | | | | | |
|---|---|---|---|---|---|
| 7,002,664 | 10/760,252 | 10/760,265 | 7,088,420 | 11/446,233 | 11/503,083 11/503,081 |
| 11/516,487 | 11/599,312 | 11/014,728 | 11/014,727 | 7,237,888 | 7,168,654 7,201,272 |
| 6,991,098 | 7,217,051 | 6,944,970 | 10/760,215 | 7,108,434 | 10/760,257 7,210,407 |
| 7,186,042 | 10/760,266 | 6,920,704 | 7,217,049 | 10/760,214 | 10/760,260 7,147,102 |
| 10/760,269 | 7,249,838 | 10/760,241 | 10/962,413 | 10/962,427 | 7,261,477 7,225,739 |
| 10/962,402 | 10/962,425 | 10/962,428 | 7,191,978 | 10/962,426 | 10/962,409 10/962,417 |
| 10/962,403 | 7,163,287 | 7,258,415 | 10/962,523 | 7,258,424 | 10/962,410 7,195,412 |
| 7,207,670 | 11/282,768 | 7,220,072 | 11/474,267 | 11/544,547 | 11/585,925 11/593,000 |
| 11/706,298 | 11/706,296 | 11/706,327 | 11/730,760 | 11/730,407 | 11/730,787 11/735,977 |
| 11/736,527 | 11/753,566 | 11/754,359 | 11/778,061 | 11/765,398 | 11/778,556 11/829,937 |
| 11/780,470 | 11/223,262 | 11/223,018 | 11/223,114 | 11/223,022 | 11/223,021 11/223,020 |
| 11/223,019 | 11/014,730 | 7,154,626 | 7,079,292 | 11/604,316 | |

The disclosures of these co-pending applications are incorporated herein by reference.

BACKGROUND OF THE INVENTION

Integrated circuits fabricated on silicon wafer substrates are electrically connected to printed circuit boards by wire bonds. The wire bonds are very thin wires—around 25 to 40 microns in diameter—extending from contact pads along the side of the wafer substrate to contacts on the printed circuit board (PCB). To protect and strengthen the wire bonds, they are sealed within a bead of epoxy called encapsulant. The wires from the contact pads to the PCB are made longer than necessary to accommodate changes in the gap between the PCB and the contact pads because of thermal expansion, flex in the components and so on. These longer than necessary wires naturally form an arc between the contact pads and the PCB. The top of the wire arc is often about 300 microns above the contact pads although some wire bonding may extend even higher. As the name suggests, the encapsulant needs to encapsulate the full length of the wire so the encapsulant bead will extend 500 microns to 600 microns proud of the contact pads.

The integrated circuit fabricated on the silicon wafer is often referred to as a 'die'. For the purposes of this specification, the term die will be used as a reference to an integrated circuit fabricated on a wafer substrate using lithographic the well known etching and deposition techniques commonly used in semiconductor fabrication. If the die is purely an electronic microprocessor, there is little need to keep close control of the encapsulant bead dimensions. However, if the die is a micro-electro mechanical systems (MEMS) device with an active upper surface, it may be necessary or desirable to bring the active surface of the die onto close proximity with another surface. One such situation applies to inkjet printheads. The proximity of the print media to the nozzle array influences the print quality. Similarly, if a cleaning surface is wiped across the nozzles, the bead of encapsulant can hamper the wiping contact.

Another problems arises because of sides of the encapsulant bead are not straight. One commonly used technique for depositing the encapsulant involves extruding it from a needle directly onto the line of wire bonds. The encapsulant volume and placement on the die is not very accurate. Variations in the pressure from the pump or slight non-uniformities in the speed of the needle cause the side of the bead contacting the active surface to be reasonably crooked. As the side of the bead is not straight, it has to be generously spaced from any active parts on the active surface to comfortably accommodate the perturbations. Spacing the electrical contacts away from the active portions (say for example, inkjet nozzles) of the active surface uses up valuable wafer real estate and reduces the number of dies that can be fabricated from a wafer disc.

In light of the widespread use of inkjet printheads, the invention will be described with specific reference to its application in this field. However, the ordinary will appreciate that this is purely illustrative and the invention is equally applicable to other integrated circuits wire bonded to a PCB or other support structure.

SUMMARY OF THE INVENTION

According to a first aspect, the present invention provides a microprocessor device comprising:

a support structure having a chip mounting area and a conductor mounting area;

a die supported on the chip mounting area, the die having a back surface in contact with the chip mounting area and an active surface opposing the back surface, the active surface having electrical contact pads;

a plurality of electrical conductors at least partially supported on the conductor mounting area; and, a series of wire bonds extending from the electrical contact pads to the plurality of electrical conductors supported on the conductor mounting area; wherein, the chip mounting area is raised relative to the conductor mounting area.

By raising the chip mounting area relative to the rest of the PCB, or at least the conductors connected to the PCB end of the wire bonds, the top of the arc formed by the layer is much closer to the active surface of the die. This, in turn, allows the bead of encapsulant to have a lower profile relative to the active surface. With a lower encapsulant bead, the active surface can be brought into closer proximity with another surface without making contact. For example, the nozzle array on a printhead IC can be 300 microns to 400 microns from the paper path.

Preferably, the chip mounting area is raised more than 100 microns relative to the conductor mounting area. Preferably, the support structure has a step between the chip mounting area and the conductor mounting area.

Preferably, the plurality of conductors are incorporated into a flexible printed circuit board (flex PCB) with a line of bond pads along an edge closest the die, the bond pads being more than 2 mm from the contacts pads on the die.

Preferably, the wire bonds are formed from wire with a diameter less than 40 microns and extend less than 100 microns above the active surface of the die.

Preferably, the wire bonds are plastically deformed such that they extend less than 50 microns above the active surface of the die.

Preferably, the active surface has functional elements spaced less than 260 microns from the contacts pads of the die. In a particularly preferred form, the die is an inkjet printhead IC and the functional elements are nozzles through which ink is ejected. In some embodiments, the support structure is a liquid crystal polymer (LCP) molding.

Preferably, the wire bonds are covered in a bead of encapsulant, the bead of encapsulant extending less than 200 microns above the active surface of the die.

Preferably, the wire bonds are covered in a bead of encapsulant, the bead of encapsulant having a profiled surface that is flat, parallel to and spaced less than 100 microns from the active surface.

Preferably, the wire bonds are covered in a bead of encapsulant, the bead of encapsulant having a profiled surface that is flat and inclined relative to the active surface.

Preferably, the wire bonds are covered in a bead of encapsulant, the encapsulant being an epoxy material that is thixotropic when uncured.

Preferably, the wire bonds are covered in a bead of encapsulant, the encapsulant being an epoxy material has a viscosity greater than 700 cp when uncured.

In a particular embodiment, the printhead IC is mounted in a printer such that during use the nozzles are less than 100 microns from the paper path.

According to a second aspect, the present invention provides a method of profiling a wire bond between a contact pad on a die, and a conductor on a supporting structure, the method comprising the steps of:

electrically connecting the contact pad on the die to the conductor on the supporting structure with a wire bond, the wire bond extending in an arc from the contact pad to the conductor;

pushing on the wire bond to collapse the arc and plastically deform the wire bond; and, releasing the wire bonds such that the plastic deformation maintains the wire bond in a flatter profile shape.

The strength of the wire bond is known to be relatively small; of the order of 3 to 5 grams force. However, the Applicant's work has found that the wire bond structure is robust enough to withstand a certain degree of work hardening from plastic deformation. The arc of the wire bond can be deformed into a flatter profile without compromising the electrical connection with the PCB.

Preferably, the die has an active surface that has functional elements, the contacts pad being formed at one edge of the active surface, the wire bond has a diameter less than 40 microns and the arc extends more than 100 microns above the active surface of the die.

Preferably, the wire bond is plastically deformed such that it extends less than 50 microns above the active surface of the die.

Preferably, the wire bond is pushed by engagement with a blade having a rounded edge section for contacting the wire bond.

Preferably, the method further comprises the steps of:
applying a bead of encapsulant over the wire bond; and,
moving a profiling surface over the active surface to flatten the bead of encapsulant.

Preferably, the bead of encapsulant having a profiled surface that is flat, parallel to and spaced less than 100 microns from the active surface.

Optionally, the bead of encapsulant having a profiled surface that is flat and inclined relative to the active surface.

Preferably, the encapsulant being an epoxy material has a viscosity greater than 700 cp when uncured. In a particularly preferred form, the encapsulant being an epoxy material that is thixotropic when uncured.

Preferably, the method further comprises the steps of:
positioning the profiling surface adjacent and spaced from the active surface to define a gap; and,
applying the bead of encapsulant onto the contact pads such that one side of the bead contacts the profiling surface and a portion of the bead extends into the gap and onto the active surface.

Preferably, the active surface has functional elements spaced less than 260 microns from the contacts pads of the die. In a particularly preferred form, the die is an inkjet printhead IC and the functional elements are nozzles through which ink is ejected. In some embodiments, the printhead IC is mounted in a printer such that during use the nozzles are less than 100 microns from the paper path.

Preferably, the support structure has a chip mounting area and a conductor mounting area, the die is supported on the chip mounting area, and a plurality of electrical conductors at least partially supported on the conductor mounting area wherein, the chip mounting area is raised relative to the conductor mounting area.

Preferably, the chip mounting area is raised more than 100 microns relative to the conductor mounting area. Preferably, the support structure has a step between the chip mounting area and the conductor mounting area. In some embodiments, the plurality of conductors are incorporated into a flexible printed circuit board (flex PCB) with a line of bond pads along an edge closest the die, the bond pads being more than 2 mm from the contacts pads on the die.

Preferably, the support structure is a liquid crystal polymer (LCP) molding.

According to a third aspect, the present invention provides a method for profiling a bead of encapsulant extending along an edge of a die mounted to a supporting structure, the method comprising the steps of:

depositing a bead of encapsulant onto wire bonds along the edge of the die;

positioning a profiling surface over the die at a predetermined spacing from the die;

moving the profiling surface across the bead before the bead of encapsulant has cured to reshape the bead profile; and, curing the bead of encapsulant.

The invention has found that the encapsulant can be effectively shaped by a profiling surface without stripping the encapsulant from the wire bonds. The normally convex-shaped upper surface of the encapsulant bead can be pushed to one side of the bead with the profiling surface. With a lower encapsulant bead, the active surface can be brought into closer proximity with another surface without making contact. For example, the nozzle array on a printhead IC can be 300 microns to 400 microns from the paper path. By collapsing or flattening the wire bond arcs before applying and profiling a bead of encapsulant, the nozzle array on the printhead IC can be less than 100 microns from the paper path.

Preferably, the wire bonds extend in an arc from respective contact pads on the die to corresponding conductors on the support structure and the method further comprises the steps of:

pushing on the wire bonds to plastically deform the wire bonds; and, releasing the wire bond such that plastic deformation maintains the wire bond in a flatter profile shape.

Preferably, the die has an active surface that has functional elements, the contacts pad being formed at one edge of the active surface, the wire bond has a diameter less than 40 microns and the arc extends more than 100 microns above the active surface of the die.

Preferably, the wire bond is plastically deformed such that it extends less than 50 microns above the active surface of the die.

Preferably, the wire bond is pushed by engagement with a blade having a rounded edge section for contacting the wire bond.

Preferably, the bead of encapsulant has a profiled surface that is flat, parallel to and spaced less than 100 microns from the active surface.

Preferably, the bead of encapsulant has a profiled surface that is flat and inclined relative to the active surface.

Preferably, the encapsulant being an epoxy material has a viscosity greater than 700 cp when uncured.

Preferably, the encapsulant being an epoxy material that is thixotropic when uncured.

Preferably, the method further comprises the steps of:

positioning the profiling surface adjacent and spaced from the active surface to define a gap; and, applying the bead of encapsulant onto the contact pads such that one side of the bead contacts the profiling surface and a portion of the bead extends into the gap and onto the active surface.

Preferably, the active surface has functional elements spaced less than 260 microns from the contacts pads of the die. In a further preferred form, the die is an inkjet printhead IC and the functional elements are nozzles through which ink is ejected. In some embodiments, the printhead IC is mounted in a printer such that during use the nozzles are less than 100 microns from the paper path.

Preferably, the support structure has a chip mounting area and a conductor mounting area, the die is supported on the chip mounting area, and a plurality of electrical conductors at least partially supported on the conductor mounting area wherein, the chip mounting area is raised relative to the conductor mounting area.

Preferably, the chip mounting area is raised more than 100 microns relative to the conductor mounting area. In a particularly preferred form, the support structure has a step between the chip mounting area and the conductor mounting area.

Preferably, the plurality of conductors are incorporated into a flexible printed circuit board (flex PCB) with a line of bond pads along an edge closest the die, the bond pads being more than 2 mm from the contacts pads on the die.

Preferably, the support structure is a liquid crystal polymer (LCP) molding.

According to a fourth aspect, the present invention provides a method of applying encapsulant to a die mounted to a support structure, the method comprising the steps of:

providing a die mounted to the support structure, the die having a back surface in contact with the support structure and an active surface opposing the back surface, the active surface having electrical contact pads;

positioning a barrier proximate the electrical contact pads and spaced from the active surface to define a gap; and, depositing a bead of encapsulant onto the electrical contact pads such that one side of the bead contacts the barrier and a portion of the bead extends into the gap and onto the active surface.

Placing a barrier over the active surface so that it defines a narrow gap allows the geometry of the encapsulant front (the line of contact between the encapsulant and the active surface) can be more closely controlled. Any variation in the flowrate of encapsulant from the needle tends to cause bulges or valleys in the height of the bead and or the PCB side of the bead. The fluidic resistance generated by the gap between the barrier and the active surface means that the amount of encapsulant that flows into the gap and onto the active surface is almost constant. The reduced flow variations make the encapsulant front closely correspond to the shape of the barrier. Greater control of the encapsulant front allows the functional elements of the active surface of the die to be closer to the contact pads.

Preferably, the barrier is a profiling surface and the method further comprises the steps of:

moving the profiling surface over the active surface to flatten the bead of encapsulant.

Preferably, the method further comprises the steps of:

prior to depositing the bead of encapsulant, electrically connecting the contact pads on the die to respective conductors on the support structure with wire bonds, the wire bonds each extending in an arc from the contact pad to the conductor;

pushing on the wire bonds to collapse the arc and plastically deform the wire bond; and, releasing the wire bonds such that plastic deformation maintain the wire bonds in a flatter profile shape.

In a further preferred form, the active surface that has functional elements, the contacts pad being formed at one edge of the active surface, the wire bond has a diameter less than 40 microns and the arc extends more than 100 microns above the active surface of the die.

Preferably, the wire bond is plastically deformed such that it extends less than 50 microns above the active surface of the die. In another preferred form, the wire bond is pushed by engagement with a blade having a rounded edge section for contacting the wire bond.

Preferably, the bead of encapsulant has a profiled surface that is flat, parallel to and spaced less than 100 microns from the active surface.

Optionally, the bead of encapsulant has a profiled surface that is flat and inclined relative to the active surface.

Preferably, the encapsulant being an epoxy material has a viscosity greater than 700 cp when uncured.

Preferably, the encapsulant is an epoxy material that is thixotropic when uncured.

Preferably, the active surface has functional elements spaced less than 260 microns from the contacts pads of the die. In a particularly preferred form, the die is an inkjet printhead IC and the functional elements are nozzles through which ink is ejected. Preferably, the printhead IC is mounted in a printer such that during use the nozzles are less than 100 microns from the paper path.

Preferably, the support structure has a chip mounting area and a conductor mounting area, the die is supported on the chip mounting area, and a plurality of electrical conductors at least partially supported on the conductor mounting area wherein, the chip mounting area is raised relative to the conductor mounting area. In a particularly preferred form, the chip mounting area is raised more than 100 microns relative to the conductor mounting area. In preferred embodiments, the support structure has a step between the chip mounting area and the conductor mounting area. In particularly preferred embodiments, the plurality of conductors are incorporated into a flexible printed circuit board (flex PCB) with a line of bond pads along an edge closest the die, the bond pads being more than 2 mm from the contacts pads on the die.

Preferably, the support structure is a liquid crystal polymer (LCP) molding.

According to a fifth aspect, the present invention provides a method of applying encapsulant to wire bonds between a die and conductors on a supporting substrate, the method comprising the steps of:
- forming a bead of the encapsulant on a profiling surface;
- positioning the profiling surface such that the bead contacts the die; and,
- moving the profiling surface relative to the die to cover the wire bonds with the encapsulant.

Wiping the encapsulant over the wire bonds with a profiling surface provides control of the encapsulant front as well as the height of the encapsulant relative to the die. The movement of the profiling surface relative to the die can closely controlled to shape the encapsulant to a desired form. Using the example of a printhead die, the encapsulant can be shaped to present an inclined face rising from the nozzle surface to a high point over the wire bonds. This can be used by the printhead maintenance facilities to maintain contact pressure on the wiping mechanism. This is illustrated further below with reference to the drawings. However, it will be appreciated that the encapsulant can be shaped to have ridges, gutters, grooves and so on by using a particular shape of profiling surface and relative movement with the die.

Preferably, the method further comprises the steps of:
- dipping the profiling surface into a reservoir of the encapsulant material to form a the bead of encapsulant material on the profiling surface.

Optionally, the profiling surface is a blade with a straight edge and the method further comprises the steps of:
- orienting the blade such that the straight edge is lowest and dipping the straight edge into the encapsulant material to form the bead of encapsulant along the straight edge.

Preferably, the die has an active surface with functional elements and a plurality of contacts pad being formed along one edge for connection with the wire bonds such that the wire bonds extend in an arc from the contacts pads to each of the conductors respectively, the wire bonds having a diameter less than 40 microns and the arc extends more than 100 microns above the active surface of the die.

Preferably, the method further comprises the steps of:
- prior to encapsulation, pushing on the wire bonds to collapse the arc and plastically deform the wire bonds; and,
- releasing the wire bonds such that plastic deformation maintains the wire bonds in a flatter profile shape.

Preferably, the wire bond is plastically deformed such that it extends less than 50 microns above the active surface of the die. Preferably, the wire bond is pushed by engagement with a blade having a rounded edge section for contacting the wire bond.

Preferably, the encapsulant covering the wire bonds has a profiled surface that is flat, parallel to and spaced less than 100 microns from the active surface.

Preferably, the bead of encapsulant having a profiled surface that is flat and inclined relative to the active surface.

Preferably, the encapsulant being an epoxy material has a viscosity greater than 700 cp when uncured.

Preferably, the encapsulant is an epoxy material that is thixotropic when uncured. Preferably, the functional elements are spaced less than 260 microns from the contacts pads of the die. In a further preferred form, the die is an inkjet printhead IC and the functional elements are nozzles through which ink is ejected. Optionally, the printhead IC is mounted in a printer such that during use the nozzles are less than 100 microns from the paper path.

Preferably, the support structure has a chip mounting area and a conductor mounting area, the die is supported on the chip mounting area, and a plurality of electrical conductors at least partially supported on the conductor mounting area wherein, the chip mounting area is raised relative to the conductor mounting area. In a particularly preferred form, the chip mounting area is raised more than 100 microns relative to the conductor mounting area. In another preferred form, the support structure has a step between the chip mounting area and the conductor mounting area. In a preferred embodiment, the plurality of conductors are incorporated into a flexible printed circuit board (flex PCB) with a line of bond pads along an edge closest the die, the bond pads being more than 2 mm from the contacts pads on the die. In some embodiments, the support structure is a liquid crystal polymer (LCP) molding.

BRIEF DESCRIPTION OF THE DRAWINGS

Embodiments of the invention will now be described by way of example only with reference to the accompanying drawings, in which.

DETAILED DESCRIPTION OF PREFERRED EMBODIMENTS

Figure 1:
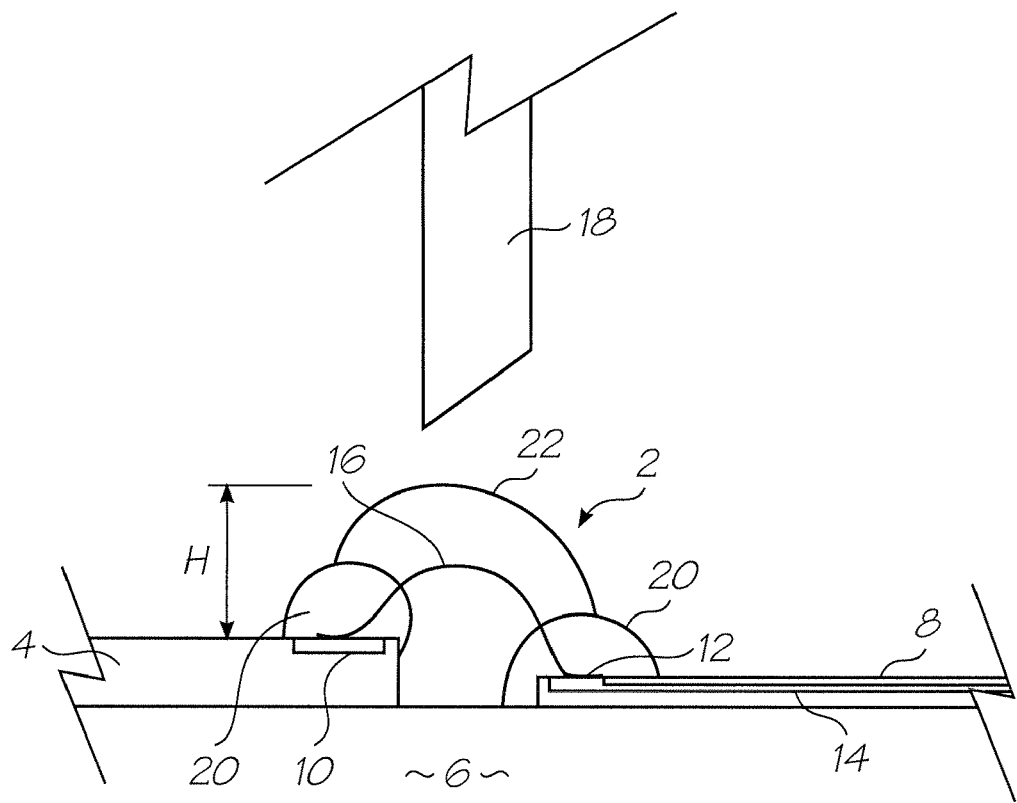
FIG. 1 is a schematic representation of a common prior art technique for applying a bead of encapsulant to wire bonds.

FIG. 1 shows a common technique used for applying a bead encapsulant to wire bonds. A die 4 is mounted to a supporting structure 6 adjacent the edge of a flex PCB 8 (flexible printed circuit board). The die 4 has a line of contact pads 10 along one edge and the flex PCB 8 has corresponding bond pads 12. Wire bonds 16 extend from the bond pads 10 to the bonds pads 12. Power and data is transmitted to the die 4 via conductive traces 14 in the flex PCB 8. This is a simplified representation of the dies mounted within many electronic devices. The printhead IC dies mounted to the LCP (liquid crystal polymer) molding to receive print data from an adjacent flex PCB, as described in U.S. Ser. No. 11/014,769 (grant U.S. Pat. No. 7,524,016) incorporated herein by cross reference, is one example of this type of die mounting arrangement. The ordinary worker will appreciate that the die may also be mounted directly to a hard PCB with traces formed thereon.

The wire bonds 16 are covered in a bead on encapsulant 2 to protect and reinforce the bonds. The encapsulant 2 is dispensed from a discharge needle 18 directly onto the wire bonds 16. Often the encapsulant bead 2 is three separate beads—two beads of so-called 'dam' encapsulant 20, and one bead of 'fill' encapsulant 22. The dam encapsulant 20 has a higher viscosity than the fill encapsulant 22, and serves to form a channel to hold the fill encapsulant bead. The height H of the bead 2 above the die 4 is usually about 500-600 microns. In most electronic devices, this does not pose a problem. However, if the die has an active surface that needs to operate in close proximity to another surface, this bead can be an obstruction.

Elevating the Die Relative to the Flex PCB

Figure 2:
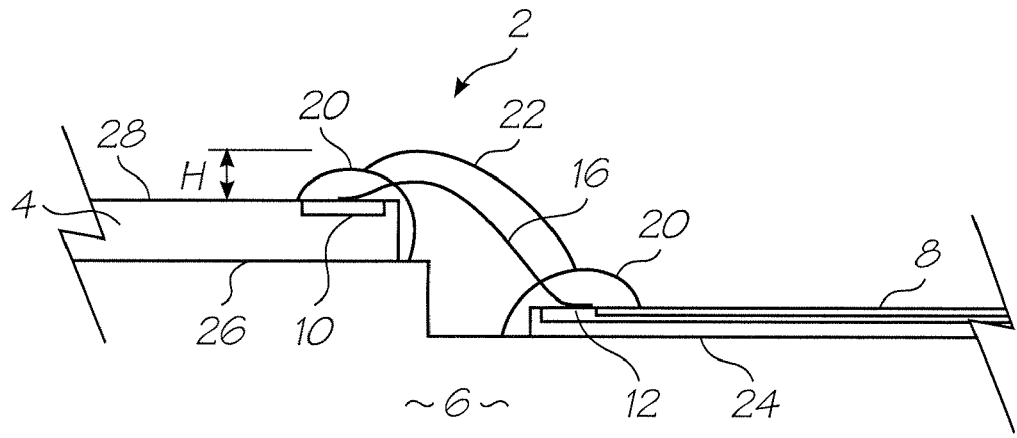
FIG. 2 is a schematic representation of a die mounted to a supporting structure with a chip mounting area raised relative to the flex PCB mounting area.

FIG. 2 shows a stepped support structure 6 that has raised the chip mounting area 26 relative to the PCB mounting area 24 (or at least the area mounting the PCB bonds pads 12). With the die 4 on a raised chip mounting area 26, the arc of the wire bonds 16 are lower relative to active surface 28 of the die 4. In fact, the end of the wire bond 16 attached to the contact pad 10 can be the apex of the arc (bearing in mind that the wire bond arc is intended to accommodate some relative movement of the die and PCB). When the wire bonds 16 are covered with encapsulant 2, the bead has a reduced height H above the active surface 28 of the die 4. If the bead of encapsulant 2 uses two beads of dam encapsulant 24 and a fill encapsulant 22, the positions, volumes and viscosities of the beads need to take the step into account. Bead heights less than 100 microns are easily achievable, and with additional measures, such as wire arc collapsing and bead profiling (discussed below), bead height of less than 50 microns are possible.

With the die 4 raised above the flex PCB 8 by 410 microns, the height of the wire bonds 16 above the die is about 34 microns. With the die raised 610 microns above the flex PCB, the wire bond height is around 20 microns. Raising the die even further has shown little or no further reduction in wire bond height with a step of 710 microns having a wire bond height of around 20 microns.

Shaping the Encapsulant Bead with a Profiling Blade

Figure 3A:
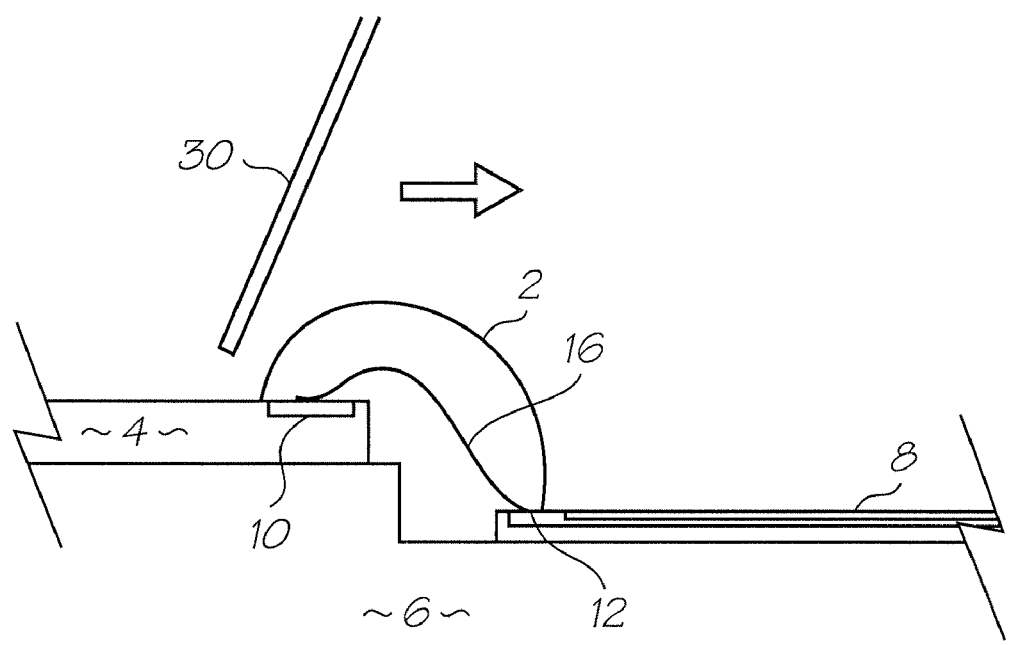
FIGS. 3A, 3B and 3C are schematic representations of the encapsulant bead being profiled into a desired shape using a moveable blade.
Figure 3B:
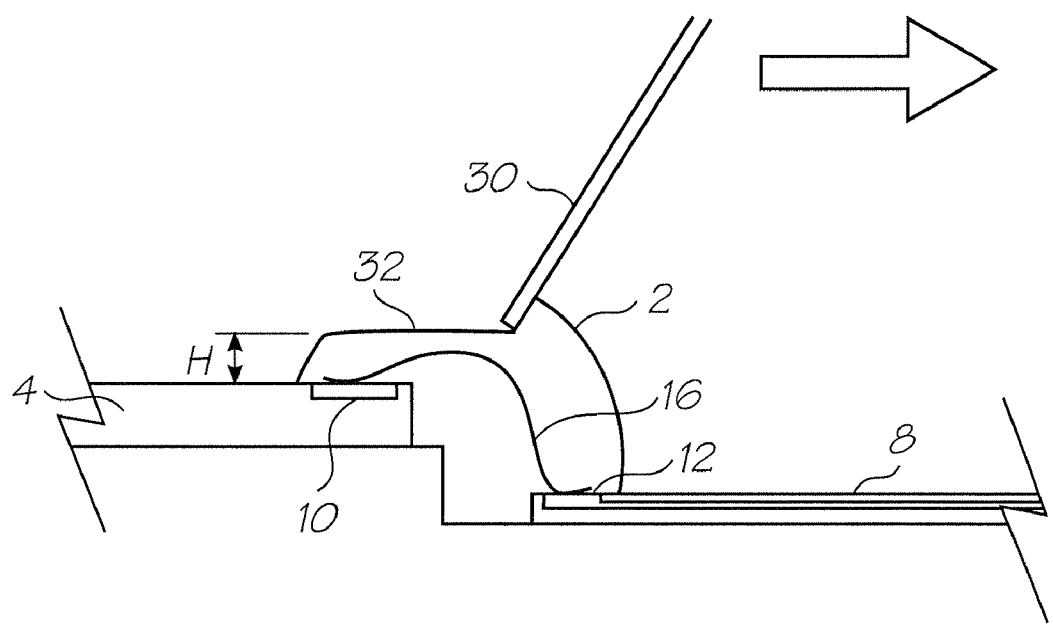
Figure 3C:
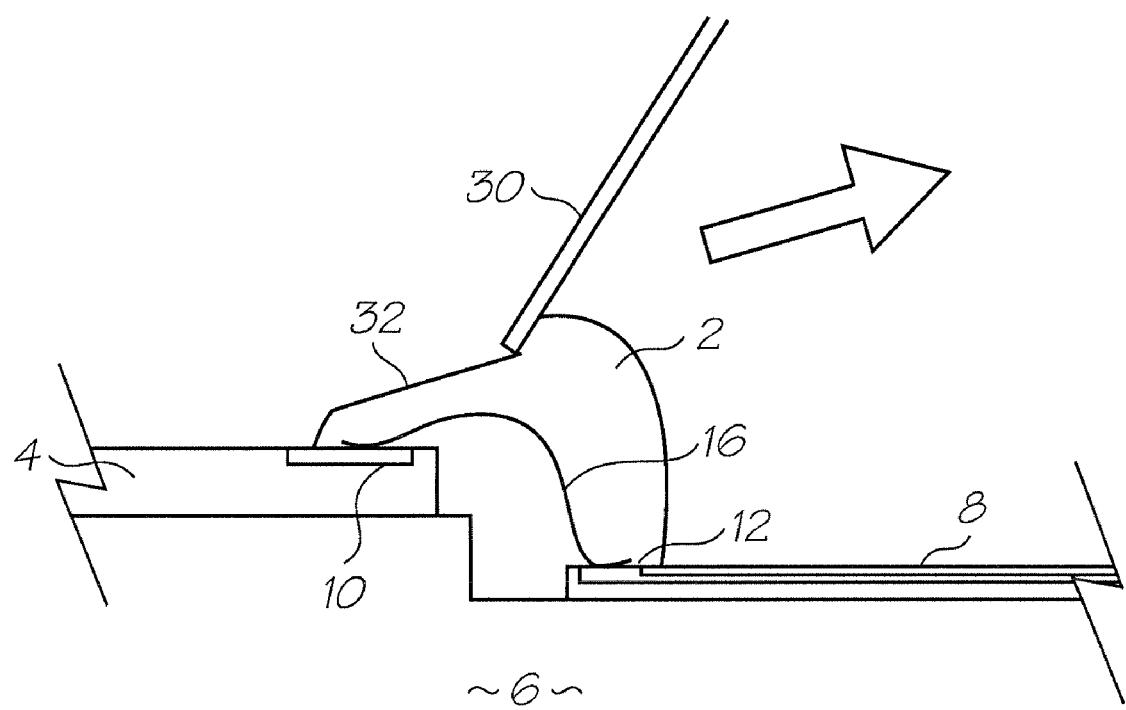

FIGS. 3A to 3C show the encapsulant 2 being profiled with a profiling blade 30. The support structure 6 is again stepped to reduce the height of the wire bonds 16 above the die 4. Before the epoxy encapsulant 2 has cured, the profiling blade 30 moves across the die 4 and wire bonds in a predetermined path. As shown in FIG. 3B, the blade 30 displaces the top of the bead 30 to its flex PCB side to form a flat top surface 32 that is at a significantly reduced height H above the die 4.

The encapsulant bead 2 may be a plurality of separate beads as shown in FIGS. 1 and 2, or a single bead of one material. However, for close dimensional control of the profiled encapsulant, the encapsulant materials used should be thixotropic—that is, once deposited from the discharge needle, or profiled by the blade 30, the material should not flow under its own weight, but rather hold its form until it cures. This requires the epoxy to have an uncured viscosity greater than about 700 cp. A suitable encapsulant is DYMAX 9001-E-v3.1 Chip Encapsulant produced by Dymax Corporation with a viscosity of approximately 800 cp when uncured. The blade 30 may be ceramic (glass) or metal and preferably about 200 microns thick.

It will be appreciated that the relative movement of the blade 30 and the die 4 can be precisely controlled. This allows the height H to be determined by the tolerance of the wire bonding process. As long as H is greater than the nominal height of the wire bond arc above the die, plus the maximum tolerance, the encapsulant 2 will cover and protect the wire bonds 16. With this technique, the height H can be easily reduced from 500-600 microns to less than 300 microns. If the heights of the wire bond arcs are also reduced, the height H of the encapsulant bead can be less than 100 microns. The Applicant uses this technique to profile encapsulant on printhead dies down to a height of 50 microns at its lowest point. As shown in FIG. 3C, the lowest point is at the encapsulant front and the blade 30 forms an inclined face 32 in the top of the bead 2. The inclined face is utilized by the printhead maintenance system when cleaning the paper dust and dried ink from the nozzle face. This illustrates the technique's ability to not just reduce the height of the encapsulant bead, but to form a surface that can perform functions other than just encapsulate the wire bonds. The edge profile of the blade and the path of the blade relative to the die can be configured to form a surface that has a multitude of shapes for a variety of purposes.

Plastic Deformation of the Wire Bond Arcs

Figure 4A:
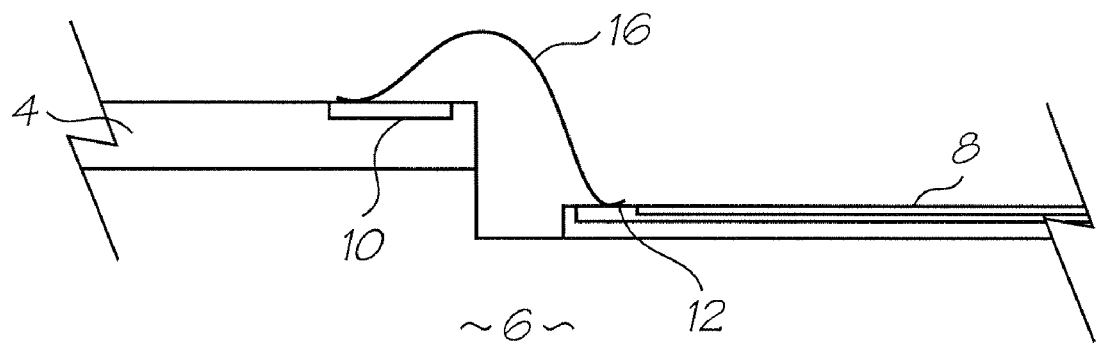
FIGS. 4A to 4D are schematic representations of wire bonds being profiled by plastic deformation.
Figure 4B:
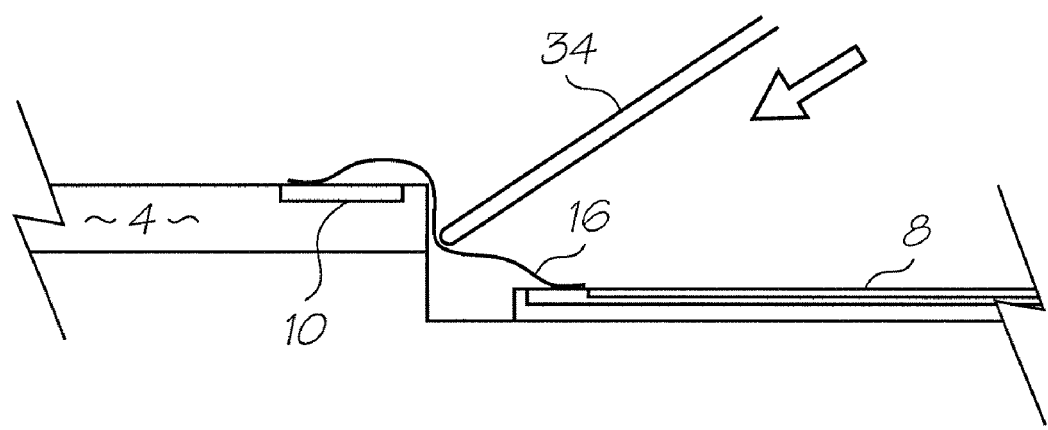
Figure 4C:
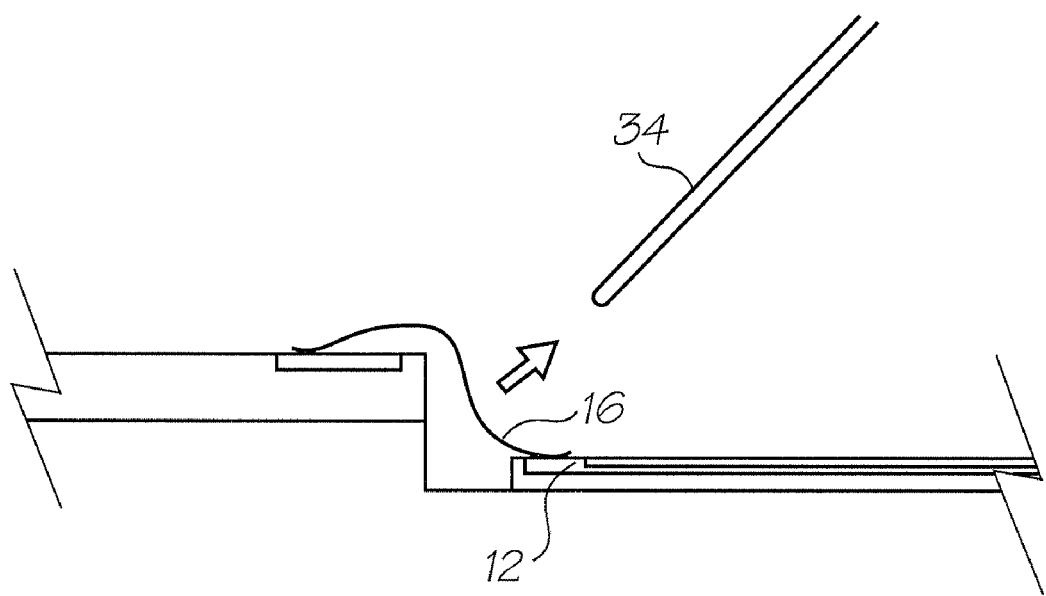

FIGS. 4A to 4C show another technique for lowering the profile of wire bonds. FIG. 4A shows the die 4 connected to the flex PCB 8 via the wire bonds 16. While the stepped support structure 6 has lowered the height of the wire bond arcs compared to a flat supporting structure, the wire bonds still have a natural tendency to bow upwards rather than downwards towards the corner of the step. The wires 16 are typically about 32 microns in diameter and have a pull force of about 3 to 5 grams force. The pull force is the tensile load necessary to break the connection to the contact pad 10 or the bond pad 12. Given the fragility of these structures (one of the reasons encapsulant is applied), conventional wisdom is to avoid any contact between the wire bond arcs and other solid surfaces.

As shown in FIG. 4B, the arc of the wire bonds 16 can be collapsed by a wire pusher 34. The wire pusher 34 displaces the wire bond 16 enough to elastically and plastically deform the arc. The Applicants have shown that contact with the wire pusher 34 can cause localized work hardening in the wire, but as long as the pushing force is not excessive, it does not break. The end of the wire pusher 34 is rounded to avoid stress concentration points. The wire pusher may be a stylus for engaging single wire bonds or a blade that pushes on multiple wire bonds simultaneously.

Referring now to FIG. 4C, the wire pusher 34 is retracted and the wire springs back toward its original shape to relieve the elastic deformation. However, the plastic deformation remains and the wire bond height above the die 4 is much reduced. Testing has shown that an initial wire bond loop height of 200 microns can be reduced to about 35 microns using this technique. Tests have also shown that the pull strength of the plastically deformed wires remains at about 3 to 5 grams force.

The collapse of the wire bonds is uncontrolled and leaves the wire bonds somewhat randomly deformed. However, pushing the wire bonds closer to the die provides more uniformly shaped collapsed wire bonds. The Applicant's work has shown that engaging the wires about 200 to 300 microns for the die provides the best results.

Figure 4D:
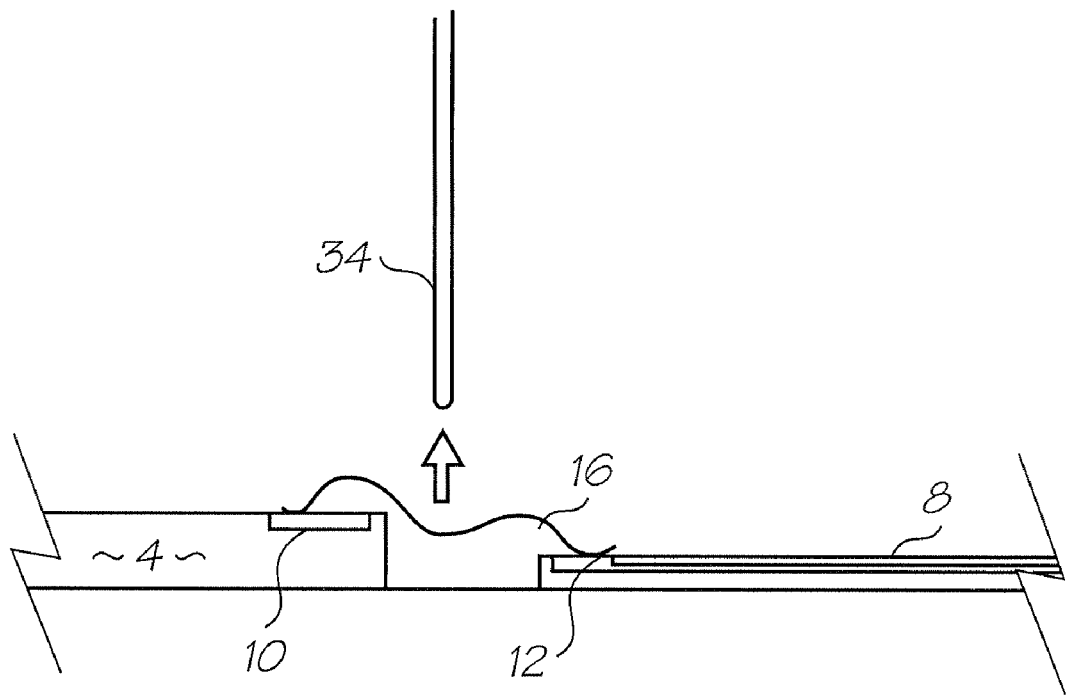

As shown in FIG. 4D, the die 4 and the flex PCB 8 are mounted to a flat support structure 6. As discussed above, this means the original loop height of the wire bond arc is much higher—approximately 400 microns above the die 4. Consequently, the wire has more plastic deformation when the loop is collapsed by the wire pusher. Even so, the Applicants results show that the residual loop height after pushing is about 20-50 microns.

Figure 5A:
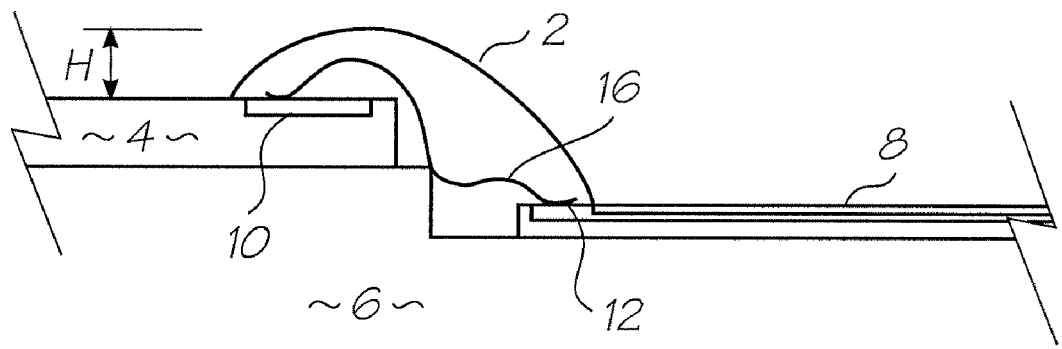
FIGS. 5A and 5B show the encapsulant bead height reductions for plastically deformed wire bonds.
Figure 5B:
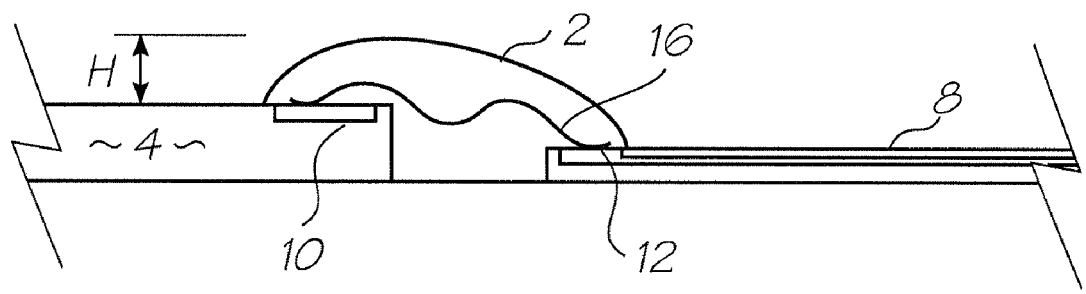

FIGS. 5A and 5B show the collapsed wire bonds 16 covered with an encapsulant bead 2. Even without bead profiling prior to curing, the height H of the bead above the die is much less than the bead necessary to encapsulate the original undeformed wire loops.

Applying Encapsulant with Profiling Blade

Figure 6A:
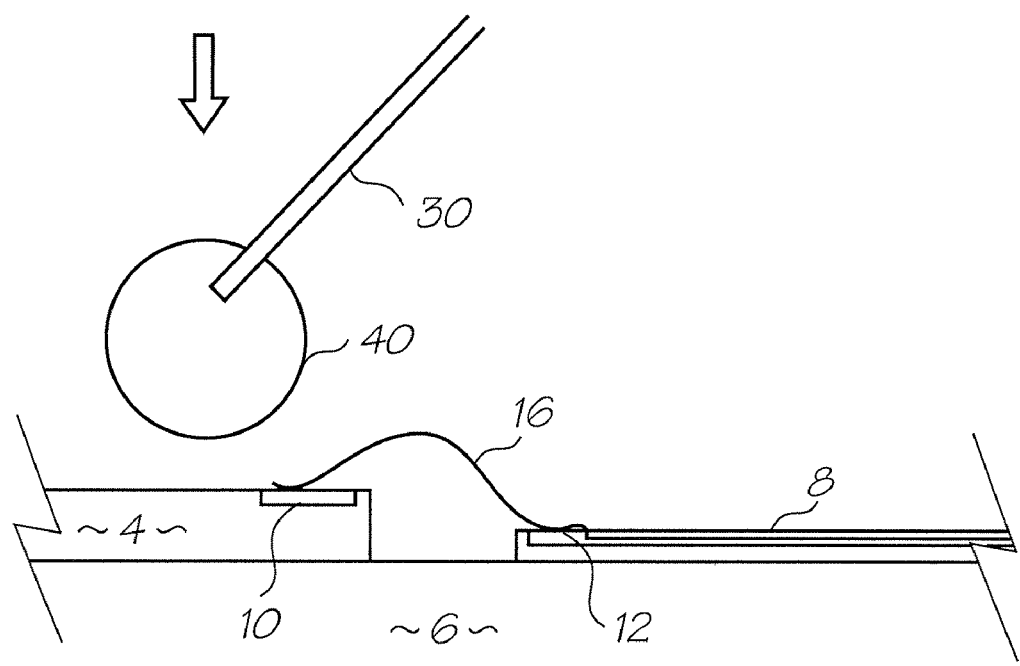
FIGS. 6A to 6C show the encapsulant bead being applied to the wire bonds using the profiling blade; and, FIGS. 7A and 7B show the profiling blade being used to control the encapsulant bead front on the surface of the die.
Figure 6B:
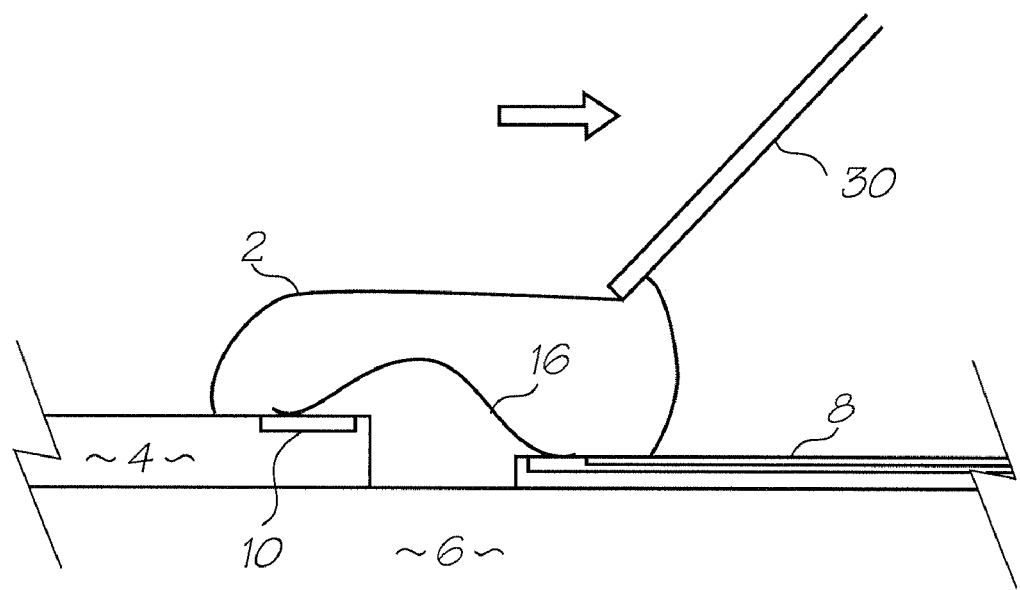
Figure 6C:
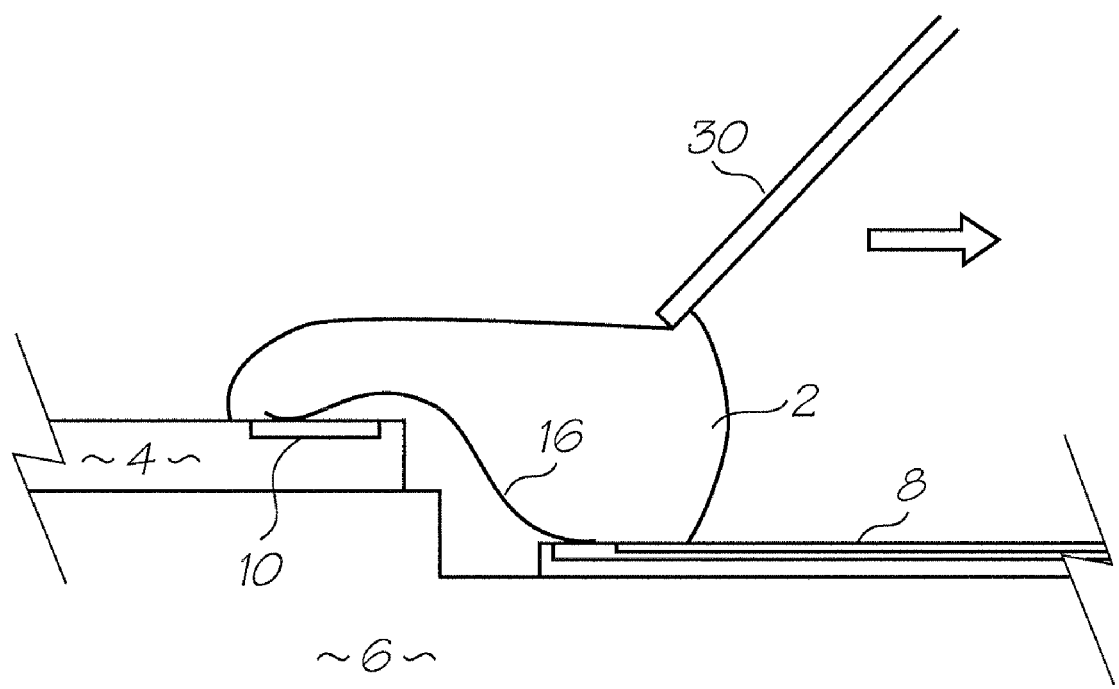

FIGS. 6A, 6B and 6C show the application of the encapsulant bead using the profiling blade 30 instead of a discharge needle (see FIGS. 1 and 2). As previously discussed, the flowrate of encapsulant from the discharge needle can vary and this gives rise to large variations on the position of the encapsulant front on the active surface of the die 4. Consequently, any functional elements in the active surface of the die need to be sufficiently spaced from the contacts pads 10 to allow for the meandering encapsulant front.

Applying the encapsulant with the profiling blade avoids the problems caused by the flowrate fluctuations from the discharge needle. As shown in FIG. 6A, the bead of encapsulant 40 can be formed on the profiling blade 30 by simply dipping it into a reservoir of uncured encapsulant epoxy. Of course, the bead 40 may also be formed by any other convenient method, such as running the discharge needle along one end of the blade 30.

FIG. 6B show the blade 30 having been lowered to touch the bead 40 onto the die 4. When the encapsulant material touches the die surface, it wets and wicks along the surface while remaining pinned to the edge of the blade. The blade 30 is held at a predetermined height above the die 4 and moved over the bead 2 to flatten and lower its profile. The encapsulant displaced from the top of the bead 2 by the blade 30, spreads over the PCB side of the bead 2. It is not relevant if the encapsulant spreads further over the PCB than necessary. As long as the wire bonds 16 and the bonds pads 12 are covered, any additional encapsulant on the PCB 8 surface is not detrimental.

In FIG. 6C, the wire bond 16 height has been reduced by collapsing the arc in accordance with the techniques discussed above. As previously discussed, the bead 2 deposited by the discharge needle need not be as big to cover the wire bond 16 once it has been collapsed. Furthermore, the blade 30 can be brought closer to the die 4 without contacting wire bonds 16 when profiling the encapsulant 2. Hence the bead profile in FIG. 6C is substantially lower than that of FIG. 6B.

Encapsulant Front Control

When the encapsulant material is dispensed from the discharge needle, minor variations in the flowrate can cause the bead to bulge at points of higher flow. Consequently, the side of the bead that contacts the active surface of the die is not straight, but has significant perturbations. These perturbations have to be accommodated between the contact pads and any functional elements on the active surface. The spacing between the contacts pads and the functional elements consumes valuable 'chip real estate'. The Applicant has previously developed printhead dies with a spacing of 260 microns between the contact pads and the first row of nozzles. Better control of the encapsulant front reduces the space between the contacts and operational elements, and so the overall dimensions of the die. Hence the design can be more compact and more chips fabricated from the original wafer disc.

Figure 7A:
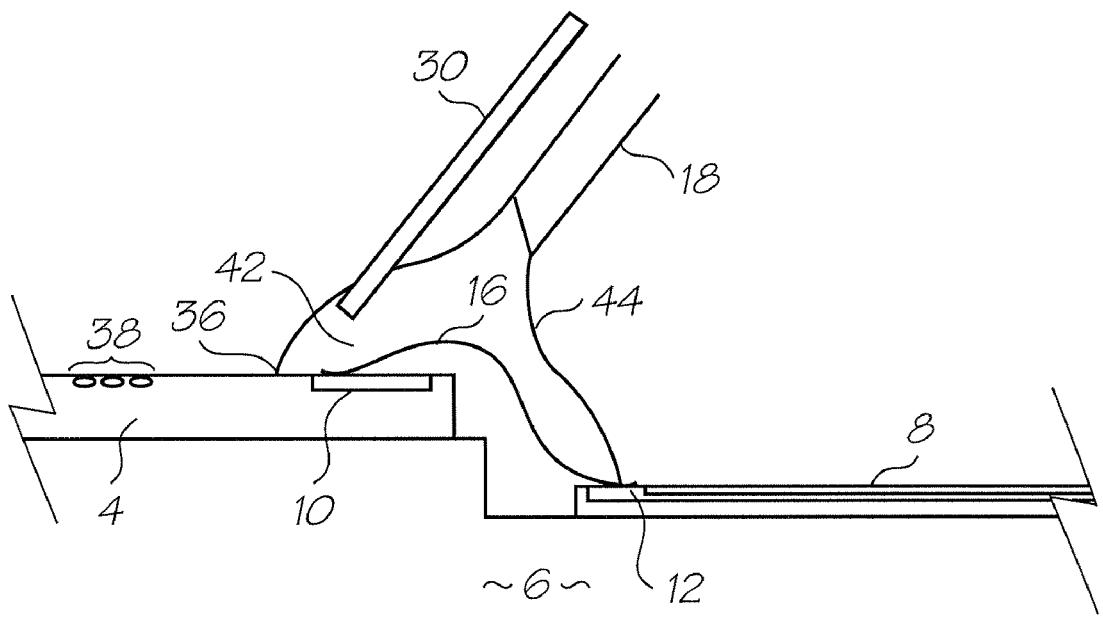
Figure 7B:
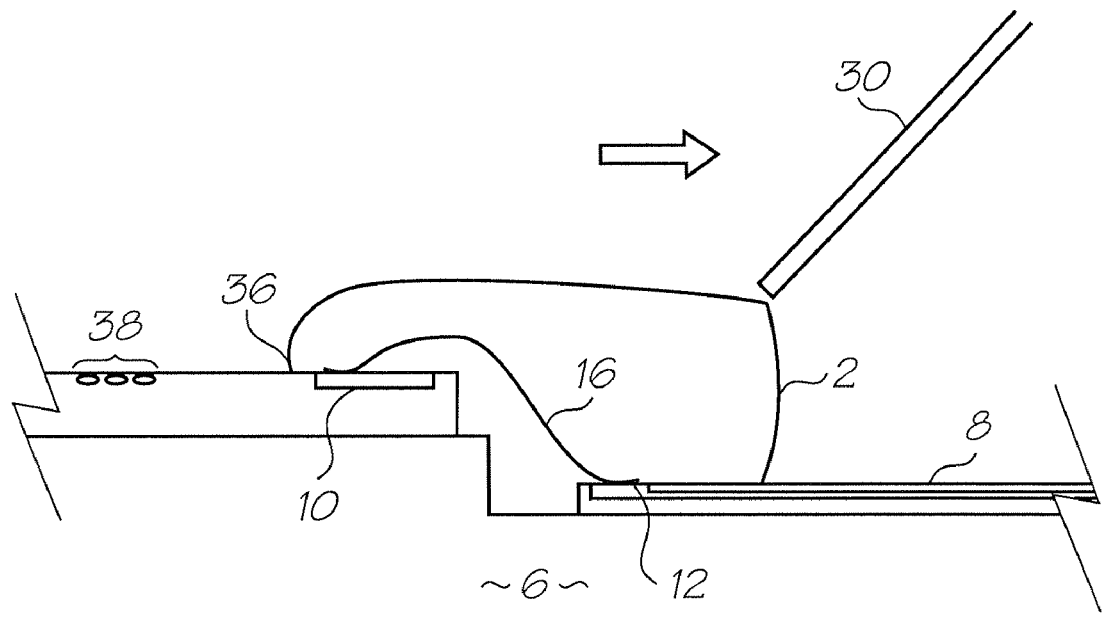

As shown in FIGS. 7A and 7B, the profiling blade 30 is used to control the front 36 of the bead of encapsulant 2. The blade 30 is positioned over the die 4 to define a gap 42 between its lower edge and the active surface 28. As the discharge needle 18 dispenses the encapsulant material 44, it flows onto the active surface, one side of the blade and a fillet of the material extends through the gap 42. Because of the flow restriction created by the gap, flow variations have a reduced effect on the dimensions of the fillet that flows through the gap. Therefore the encapsulant front 36 closely corresponds to the line of the lower edge of the blade 30.

As shown in FIG. 7B, the profiling blade 30 is already in position to profile the encapsulant bead 2 once it has been dispensed from the discharge needle. The blade 30 simply moves over the die 4 in a direction away from the nozzles 38. This keeps the encapsulant front 36 in place and flattens the profile of the encapsulant bead 2 over the wire bonds 16.

The invention has been described herein by way of example only. The ordinary will readily recognize many variations and modifications which do not depart from the spirit and scope of the broad inventive concept.

The invention claimed is:

1. A method of profiling a wire bond between a contact pad on a die, and a conductor on a supporting structure, the die having an active surface that has functional elements, the contact pad being formed at one edge of the active surface, the method comprising the steps of:
    electrically connecting the contact pad on the die to the conductor on the supporting structure with a wire bond, the wire bond extending in an arc from the contact pad to the conductor;
    pushing on part of an upper surface of the wire bond using a wire pusher to collapse the arc and plastically deform the wire bond without depositing material on the part of the upper surface;
    releasing the wire pusher so as to expose the part of the upper surface of the wire bond, whereby plastic deformation only maintains the wire bond in a flatter profile shape;
    applying a bead of encapsulant over the wire bond after releasing the wire pusher; and,
    moving a profiling surface away from the functional elements on the active surface to push some of the encapsulant material away from the functional element, such that the functional elements remain exposed while the bead of encapsulant is flattened.

2. A method according to claim 1 wherein the wire bond has a diameter less than 40 microns and the arc extends more than 100 microns above the active surface of the die.

3. A method according to claim 2 wherein the wire bond is plastically deformed such that it extends less than 50 microns above the active surface of the die.

4. A method according to claim 1 wherein the wire bond is pushed by engagement with a blade having a rounded edge section for contacting the wire bond.

5. A method according to claim 1 wherein the bead of encapsulant having a profiled surface that is flat, parallel to and spaced less than 100 microns from the active surface.

6. A method according to claim 1 wherein the encapsulant being an epoxy material has a viscosity greater than 700 cp when uncured.

7. A method according to claim 1 wherein the encapsulant being an epoxy material that is thixotropic when uncured.

8. A method according to claim 1 further comprising the steps of:
    positioning the profiling surface adjacent and spaced from the active surface to define a gap; and,
    applying the bead of encapsulant onto the contact pads such that one side of the bead contacts the profiling surface and a portion of the bead extends into the gap and onto the active surface.

9. A method according to claim 8 wherein the active surface has functional elements spaced less than 260 microns from the contacts pads of the die.

10. A method according to claim 8 wherein the die is an inkjet printhead IC and the functional elements are nozzles through which ink is ejected.

11. A method according to claim 10 wherein the printhead IC is mounted in a printer such that during use the nozzles are less than 100 microns from the paper path.

12. A method according to claim 1 wherein the support structure has a chip mounting area and a conductor mounting area, the die is supported on the chip mounting area, and a plurality of electrical conductors at least partially supported on the conductor mounting area wherein, the chip mounting area is raised relative to the conductor mounting area.

13. A method according to claim 12 wherein the chip mounting area is raised more than 100 microns relative to the conductor mounting area.

14. A method according to claim 13 wherein the support structure has a step between the chip mounting area and the conductor mounting area.

15. A method according to claim 13 wherein the plurality of conductors are incorporated into a flexible printed circuit board (flex PCB) with a line of bond pads along an edge closest the die, the bond pads being more than 2 mm from the contacts pads on the die.

16. A method according to claim 15 wherein the support structure is a liquid crystal polymer (LCP) molding.

* * * * *